United States Patent [19]

Tumpey et al.

[11] Patent Number: 5,013,948
[45] Date of Patent: May 7, 1991

[54] HIGH POWER ROTATING RECTIFIER ASSEMBLY

[75] Inventors: John J. Tumpey, Oakhurst; Richard J. Becker, Brick, both of N.J.

[73] Assignee: Allied-Signal Inc., Morris Township, Morris County, N.J.

[21] Appl. No.: 455,214

[22] Filed: Dec. 22, 1989

Related U.S. Application Data

[63] Continuation-in-part of Ser. No. 370,930, Jun. 23, 1989, which is a continuation-in-part of Ser. No. 212,759, Jun. 29, 1988, abandoned, which is a continuation-in-part of Ser. No. 45,930, May 4, 1987, Pat. No. 4,794,048, which is a continuation-in-part of Ser. No. 371,362, Jun. 26, 1989, Pat. No. 4,959,572.

[51] Int. Cl.⁵ ............................ H02K 9/22; F28F 9/08
[52] U.S. Cl. .................................... 310/68 D; 310/64; 357/81
[58] Field of Search .................. 310/45, 64, 68 D; 357/71, 76, 77, 80, 81; 363/126, 145

[56] References Cited

U.S. PATENT DOCUMENTS

| | | | |
|---|---|---|---|
| 3,829,725 | 8/1974 | Petersen et al. | 310/68 D |
| 4,458,305 | 7/1984 | Buckle et al. | 363/132 |
| 4,700,273 | 10/1987 | Kaufman | 357/81 |
| 4,703,339 | 10/1987 | Matsuo | 357/81 |
| 4,782,254 | 11/1988 | Kreuzer et al. | 310/45 |

Primary Examiner—Steven L. Stephan
Assistant Examiner—D. L. Rebsch
Attorney, Agent, or Firm—Howard G. Massung; Robert A. Walsh

[57] ABSTRACT

A rotating rectifier assembly has a substrate which has a metal core and a ceramic coating. An exciter rotor which produces an ac signal and the rectifier assembly are disposed about a generator shaft. The substrate has rectifiers arranged in a rectifying circuit. An ac lead extends from the ac windings in the exciter rotor to the rectifying circuit where a dc signal is generated and fed to a main generator rotor.

25 Claims, 5 Drawing Sheets

HIGH POWER ROTATING RECTIFIER ASSEMBLY

CROSS-REFERENCE TO RELATED APPLICATIONS

This application is a Continuation-In-Part of United States Ser. No. 370,930 filed June 23, 1989 which, in turn, is a Continuation-In-Part of United States Ser. No. 212,759 filed June 29, 1988 (now abandoned) which, in turn, is a Continuation-In-Part of Ser. No. 045,930, filed 5/4/87, now U.S. Pat. No. 4,794,048. This application is also a Continuation-In-Part of United States Ser. No. 371,362 filed June 26, 1989, now U.S. Pat. No. 4,959,572.

BACKGROUND OF THE INVENTION

This invention relates to rotating rectifier assemblies for electric machines. More specifically, this invention relates to a rotating rectifier assembly for ac generators having a substrate disposed about a rotating shaft which provides improved heat dissipation.

Self-excited brushless ac generators typically utilize a rotating rectifier assembly to rectify the output of an exciter rotor and to feed the resulting dc voltage to a main generator rotor. Rectifier diodes enclosed in DO-5 cases have been traditionally used in such rotating rectifier assemblies. Such assemblies were acceptable for use in generators which rotated at relatively low speeds and which have space available for the required mounting and the electrical interconnections. Recently, however, the trend in state of the art generators, particularly aircraft generators, has been towards increased generator output ratings and towards reduced generator weight and volume. These recent requirements have increased the current densities which must be generated in the windings of the generator, thereby making power dissipation more difficult.

Earlier rotating rectifier assemblies did not generate the higher current density required in today's aircraft generator and, therefore, did not have the associated heat dissipation problems. Also, earlier rotating rectifier assemblies were large and were typically mounted in a metal casing, thereby alleviating heat dissipation difficulties. The reduced weight and volume coupled with the increased power outputs and speed of today's generators, however, does not permit the use of such earlier rotating rectifier assemblies.

A rotating rectifier assembly which generates higher current outputs and which can provide greater heat dissipation, therefore, is needed.

SUMMARY OF THE INVENTION

The present invention is a rotating rectifier assembly disposed in an electric machine about a rotatable shaft for rotation therewith for rectifying a poly-phase ac signal generated by a plurality of windings in an exciter rotor.

The rotating rectifier assembly includes a substrate having a metal core and a ceramic coating. Diodes arranged in rectifier circuit are mounted on conductive layers electrically isolated from the substrate. The ac signal is supplied to the rectifier circuit for rectification, preferably full-wave rectification. The resulting dc signal is output to a main generator rotor An object of the present invention is to provide a rotating rectifier assembly which can dissipate heat with improved efficiency.

It is further an object of the present invention to provide a rotating rectifier assembly which can generate higher current densities.

It is another object of the present invention to provide a rotating rectifier assembly which is light weight.

It is yet another object of the present invention to provide a rotating rectifier assembly which is small of volume.

It is a further object of the present invention to provide a rotating rectifier assembly having reduced mass.

DESCRIPTION OF THE PREFERRED EMBODIMENT

Figure 1:
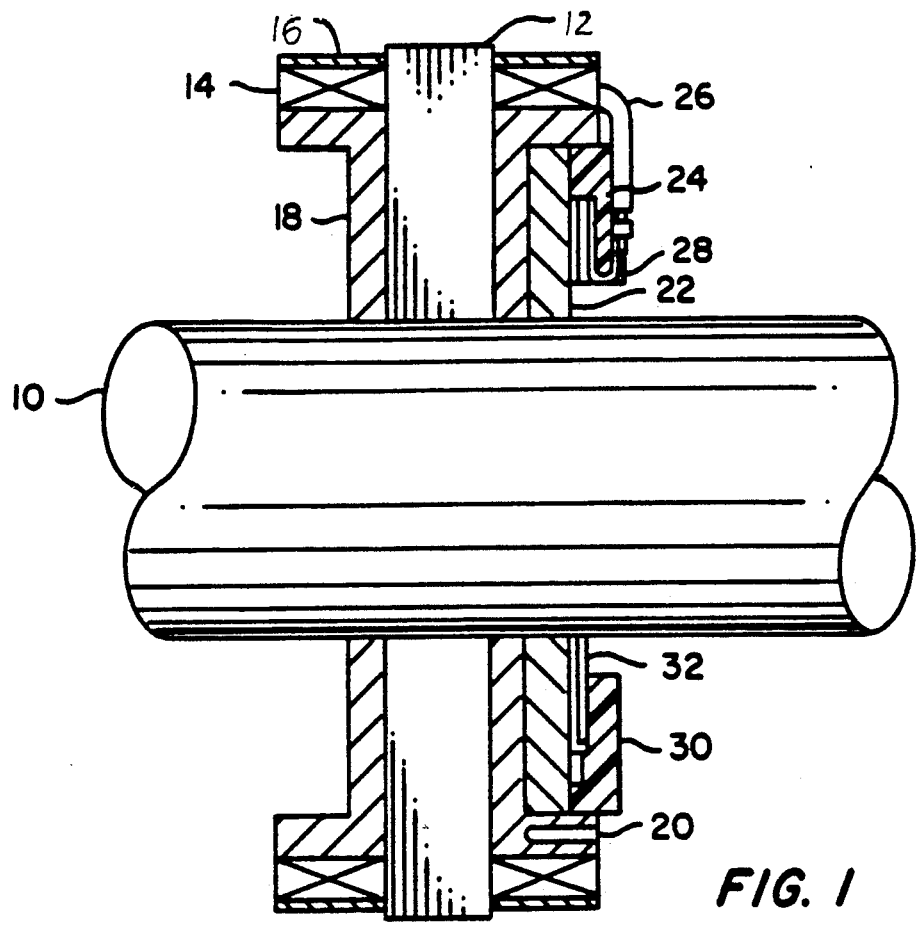
FIG. 1 is a section view of a preferred embodiment of the rotating rectifier assembly of the present invention disposed about a main generator shaft and mounted to an exciter rotor.

FIG. 1 illustrates a section view of a preferred embodiment of a rotating rectifier assembly of the present invention disposed about a main generator shaft 10 and mounted to an exciter rotor so that the rotating rectifier assembly rotates with the shaft 10. The exciter rotor includes a magnetic exciter stack 12, ac windings 14 and a support ring 16 for the AC windings 14. As the exciter rotor and the shaft 10 rotate together, a three-phase electrical current is induced in the ac windings 14 by means of the magnetic exciter stack 12 and stationary field poles and windings (not shown). The induced ac current is rectified by the rotating rectifier assembly of the present invention.

An aluminum heat sink 18 is secured to the exciter rotor and shrink fit onto the main generator shaft 10 to provide a heat transfer path through which heat is transferred from the windings 14 and the magnetic core 12 to the generator shaft 10 in an oil conduction cooled machine. Further, a balancing ring 20 is provided within the exciter rotor, which provides the same function as the aluminum heat sink 18 in addition to balancing the entire assembly.

The section view of FIG. 1 of the rotating rectifier assembly of the present invention illustrates a substrate 22, a rectifier 24, an ac lead 26, a bus bar 28, a ring 30 and a dc lead 32. The number of rectifiers 24 is dependent on the number of phases in the ac signal to be rectified and the required power levels. In the preferred embodiment wherein full wave rectification is performed, there is at least a pair of rectifiers per phase of the ac signal, with a greater number provided in cases where the power levels to be dissipated by a rectifier 24 exceeds the rating of the rectifier 24. There is one ac lead 26 per phase of the ac signal to be rectified and there are two dc leads 32.

The substrate 22 is disposed about the shaft 10 for rotation therewith. Preferably, a substrate 22 is secured to the exciter rotor by means of a shrink fit to the shaft 10, thereby providing a transfer path from the rectifier 24 to the shaft 10 for the heat generated by the rectifier circuit. Each rectifier 24 is secured to the substrate. A bus bar 28 has a first section connected to each pair of rectifiers and a second section extending from the first section which is secured to one of the ac leads 26. The support ring 30 is secured for rotation with the substrate 22 and the exciter rotor. The second section 26 of the bus bar 28 curls or wraps around the ring 30, so that when the shaft 10 in the rotating rectifier assembly rotates, the centrifugal forces exerted on the bus bar 28 are opposed by the force the ring 30 exerts on the bus bar 28. This arrangement, therefore, provides a rotating rectifier assembly having stability and reliability even at high rotational speeds.

Figure 2:
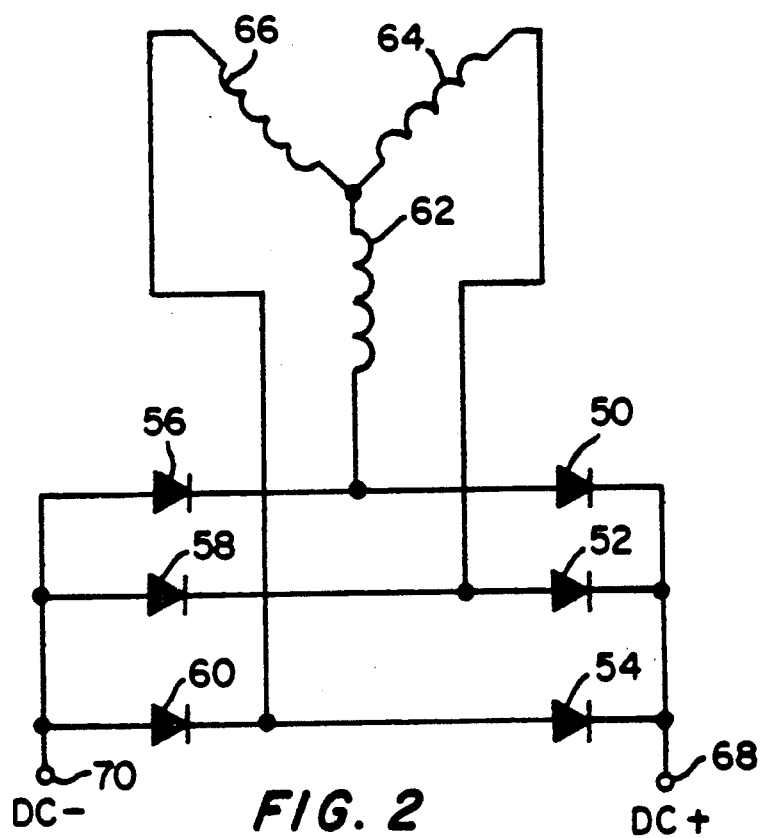
FIG. 2 is an electrical schematic of a three-phase rectifier circuit.

The rotating rectifier assembly is most commonly used to full wave rectify a three phase ac signal. FIG. 2 illustrates the electrical schematic of a typical three-phase rectifying circuit which can be used by the rotating rectifier assembly of the present invention. Six rectifiers 50, 52, 54, 56, 58 and 60 are provided in a standard three phase, full-rectifier circuit. Each phase of the ac signal is received from a respective winding 62, 64 and 66. These windings 62, 64 and 66, correspond to the ac winding 14 illustrated in FIG. 1. The dc output from the circuit of FIG. 2 is provided at terminals 68 and 70.

Figure 3:
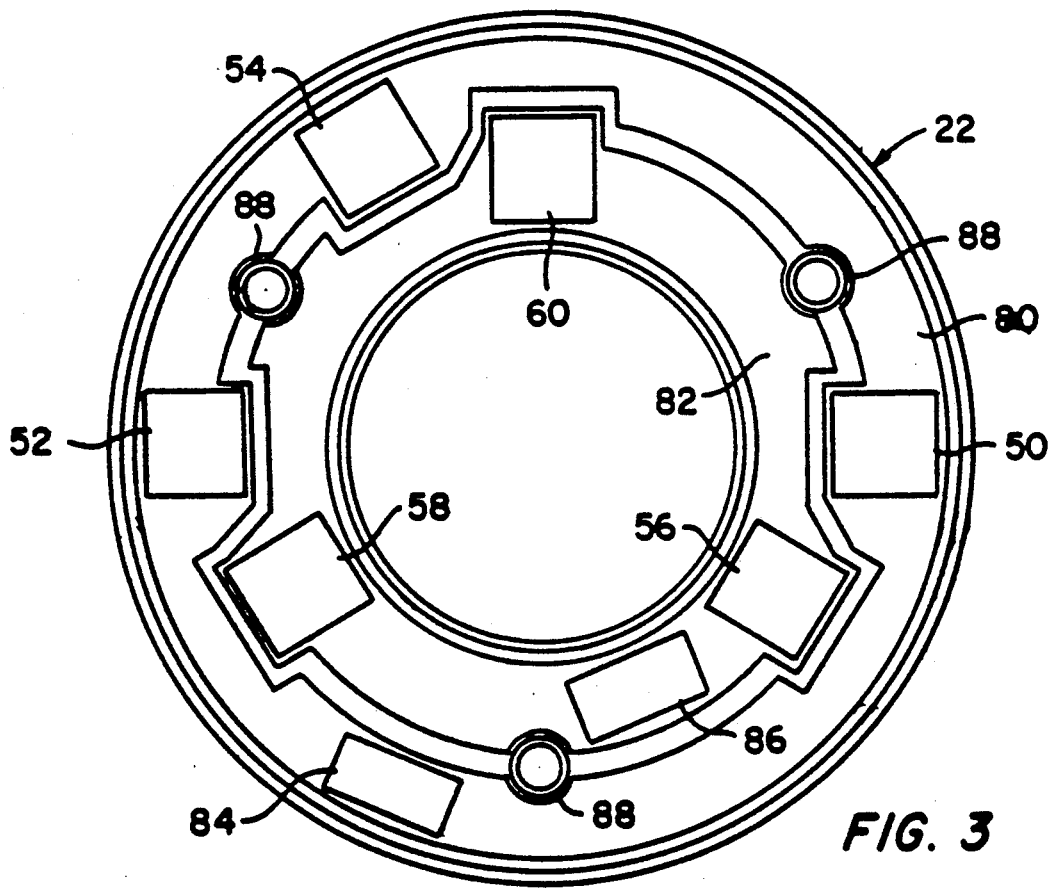
FIG. 3 illustrates the rectifier layout on a substrate in accordance with a preferred embodiment of the present invention.

FIG. 3 illustrates the rectifier layout on the substrate 22 in accordance with a preferred embodiment of the present invention. Two conductive areas 80 and 82 are provided on the rectifier substrate 22. The cathodes of rectifiers 50, 52 and 54 are secured to the first conductive area 80 by a one step soldering process, as follows. The rectifiers are located in a solder fixture having leaf spring type clips which apply pressure to each rectifier during assembly. The rectifiers are assembled in a hydrogen atmosphere at 310° C. The assembled rectifiers are then soldered to the respective conductive area at 266° C. in an oxygen-free environment to insure the integrity of the rectifier solder and to prevent oxidation. The bus bars are soldered at the same time using the same type clips to keep the whole assembly in compression. The dc connection pads 84 and 86 are also soldered to their respective conductive area at the same time in the same fashion. The entire operation is performed on a temperature-controlled hot plate using solder preforms.

Referring to FIG. 2, the interconnections at terminal 68 between the cathodes of rectifiers 50, 52 and 54 are, therefore, provided by the first conductive area 80 on the substrate 22. The anodes of the rectifiers 56, 58 and 60 are similarly secured to the second conductive area 82. Referring to FIG. 2, the interconnections at terminal 70 between the anodes of rectifiers 56, 58 and 60 are, therefore, provided by the second conductive area 82 on the substrate 22.

A dc lead, such as lead 32 illustrated in FIG. 1, is secured to each pad 84 and 86. The dc signal resulting from the operation of the rotating rectifier assembly is provided across these dc leads. Mounting holes 88 are provided so that the substrate 22 can be secured to the exciter rotor.

Referring to the schematic in FIG. 2, the interconnection between the exposed anode of the rectifier 50, the exposed cathode of rectifier 56 and the winding 62 is made with a conductive bus bar 28. Similarly, the interconnection between the exposed anode of the rectifier 52, the exposed cathode of the rectifier 58 and the winding 64 and the interconnection between the exposed anode of the rectifier 54, the exposed cathode of the rectifier 60 and the winding 66 are made with bus bars 28.

Figure 4:
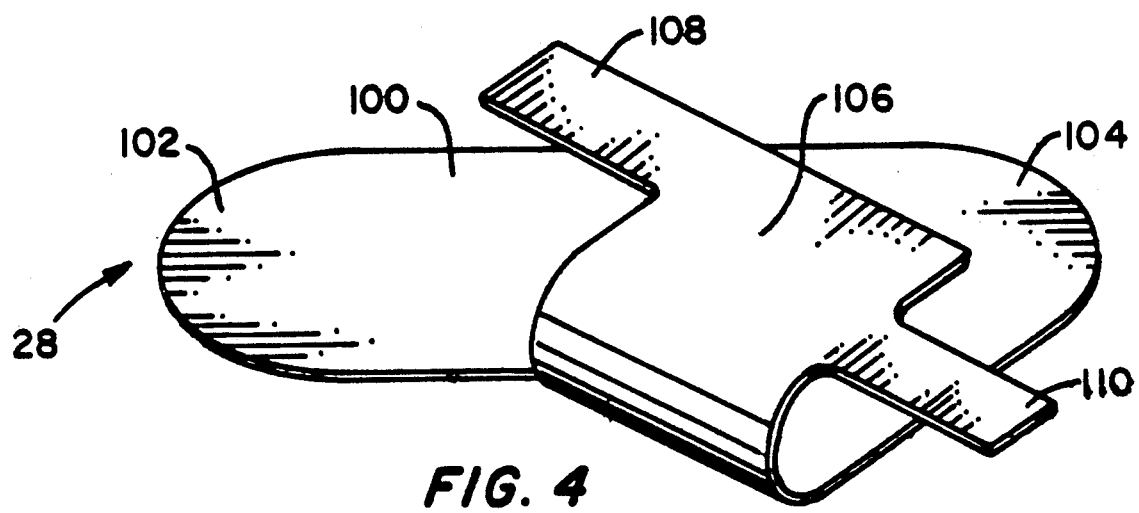
FIG. 4 illustrates a bus bar in accordance with a preferred embodiment of the present invention.

FIG. 4 illustrates a bus bar 28 in accordance with a preferred embodiment of the present invention having a first section 100 with a first end 102 and a second end 104. Further, the bus bar 28 has a second section 106 extending from the first section 100. Fingers 108 and 110 extend outward from the second section 106. These fingers 108 and 110 are folded over to crimp the ac leads 26 from the ac windings 14 to the bus bar 28, thereby providing the ac signals as inputs to the rotating rectifier assembly.

Figure 5:
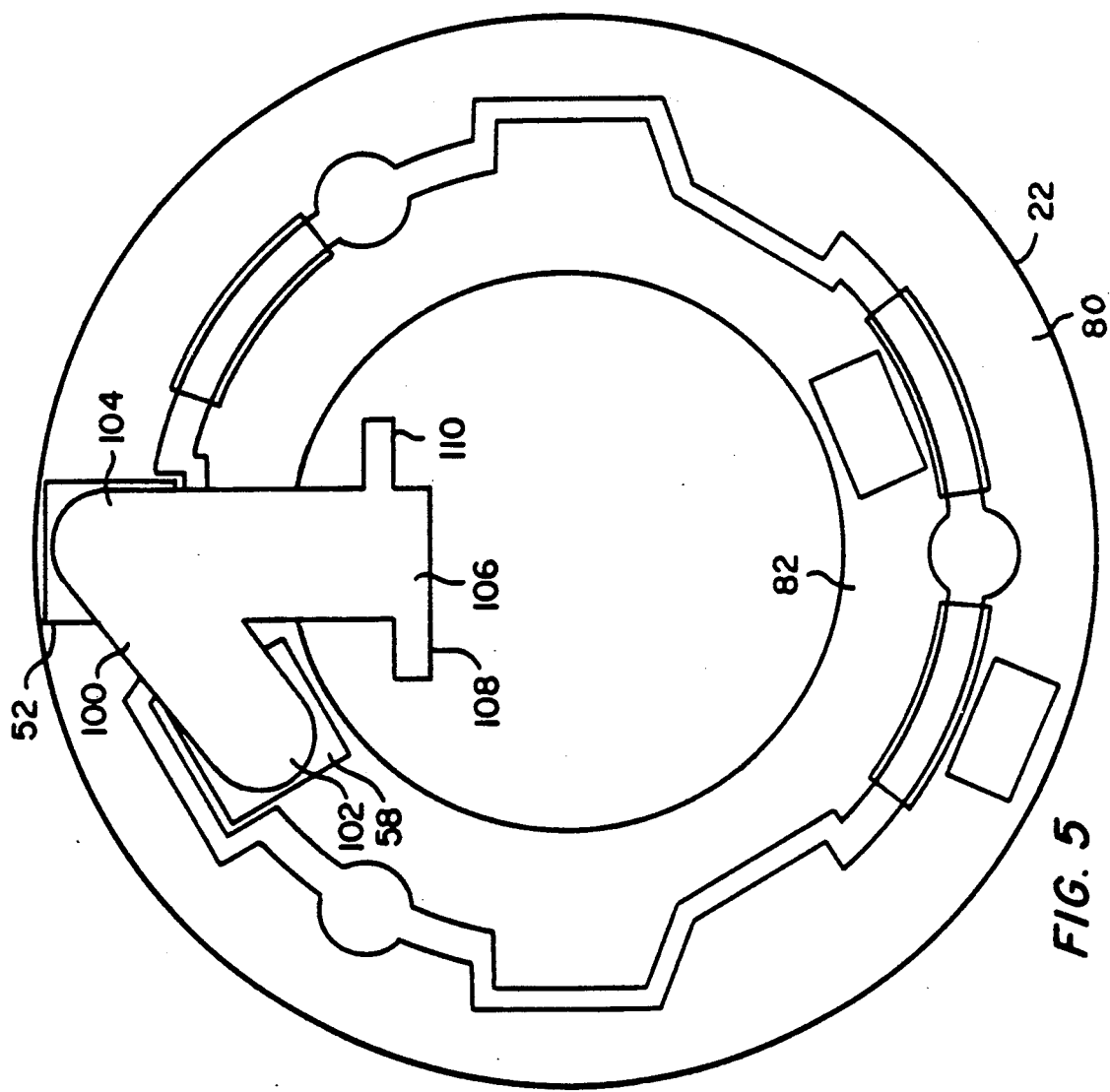
FIG. 5 illustrates the bus bar assembled to two adjacent rectifies in the rotating rectifier assembly; and, FIGS. 6 and 7 illustrate a support ring in accordance with a preferred embodiment of the present invention.

FIG. 5 illustrates a bus bar 28 mounted to two rectifiers 52 and 58 before it is curled around the support ring 30. The first end 102 of the first section 100 is soldered to the exposed cathode of the rectifier 58. The second end 104 of the first section 100 is soldered to the exposed anode of the rectifier 52 as previously described.

Once the bus bars 28 have been soldered to the remaining pairs of rectifiers 50, 56, 54 and 60 the rotating rectifier assembly is disposed about the main generator shaft 10. The bus bar 28 must be fabricated with a conductive material. It is preferable to use soft pliable metal, such as copper. This allows the second section 106 to bend to a position along the axis of the shaft 10 during assembly. It is further preferred that the copper be electroless nickel plated to prevent solder migration.

Figure 6:
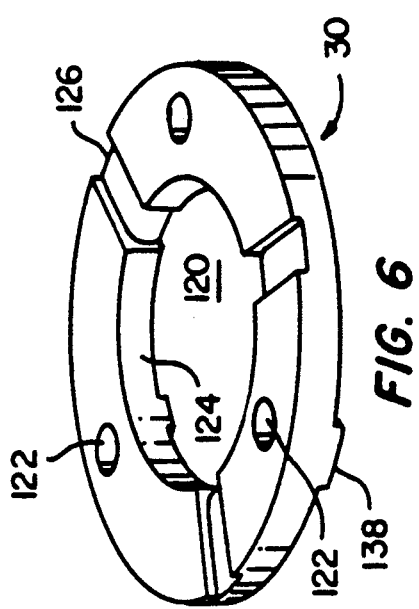
Figure 7:
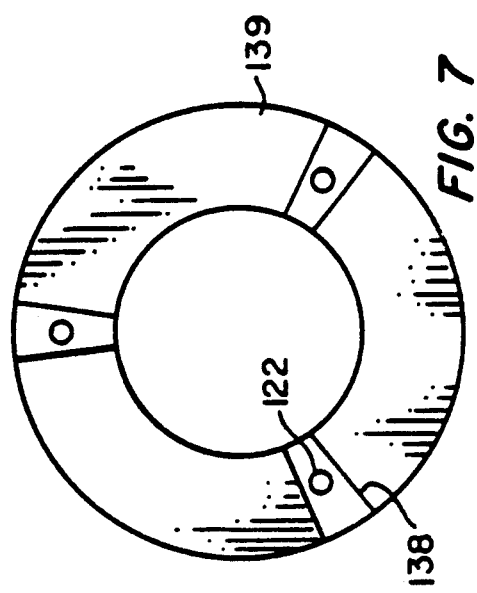

FIGS. 6 and 7 illustrate a support ring 30 which is disposed about the shaft 10 such that the second section 106 passes through the hole 120 through which the shaft 10 fits. The support ring 30 has mounting holes 122 which mate with the mounting holes 88 provided in the substrate 22. A fastening device, preferably a screw, is used to secure the ring 30 and the substrate 22 to the exciter rotor.

When the supporting ring 30 is assembled onto the substrate 22 and the exciter rotor, the second section 106 of the bus bar 28 is curled or wrapped around the ring 30. The second section 106 preferably contacts an inner sleeve 124 of the ring 30 so that when the assembly rotates the centrifugal forces exerted on the bus bar 28, particularly on the second section 106, will be opposed by the inner sleeve 124 of the support ring 30.

In a preferred embodiment, the ring 30 has a channel 126 adapted for receipt of the bus bar 28. The channel 126 extends through a section of the inner sleeve 124 and through a section of the face 127 which faces away from the substrate 22. The second section 106 from each of the bus bars 28 fits into this channel 126 and conforms to its shape during rotation. The channel 126 provides additional support for the second section 106 against the forces exerted during rotation of the assembly. The ac lead 26 is inserted within the fingers 128 on the second section 126 of the bus bar 28. The fingers 108 and 110 are then crimped about the ac lead 26 to secure the lead to the bus bar 28. The bus bar 28 is then further secured into the channel 126 by epoxy.

The ring is preferably fabricated from a composite PEEK resin epoxy which has been injection molded. The inner diameter of the ring 30 can be further strengthened and reinforced by high strength composite fibers.

FIG. 7 illustrates the face of the support ring 30 adjacent the rectifier substrate 22. In one embodiment, preferred at lower speeds, the area 138 underneath the mounting holes 122 is built up so that the face 139 clears all of the components on the rectifier substrate 22. This embodiment permits air to reach the rectifiers.

In another embodiment, preferred at high speeds, the area 138 is built up only slightly such that a surface 139 on the ring 30 is in contact with the bus bar 28 to keep the rectifiers and the bus bar 28 in compression.

In alternate embodiments, the bus bar 28 may assume a number of shapes other than that illustrated in FIG. 4. In further embodiments, the ac signal to be rectified can be single phase or polyphase or the rotating rectifier can be used to half wave rectify an ac signal. In this case, only one rectifier per phase of the ac signal need be provided and the substrate need only have a single exposed conductive area. The bus bars are secured to a single rectifier and the support ring positioned over the bus bars as previously described.

In cases where the power to be generated exceeds the rating of a rectifier component to be used, additional rectifiers can be added. In this case, the interconnection between the rectifiers and the ac signal is again made with the bus bars, so that the bus bar must be configured to be secured with all the rectifiers related to the phase of the ac signal being rectified.

Figure 8:
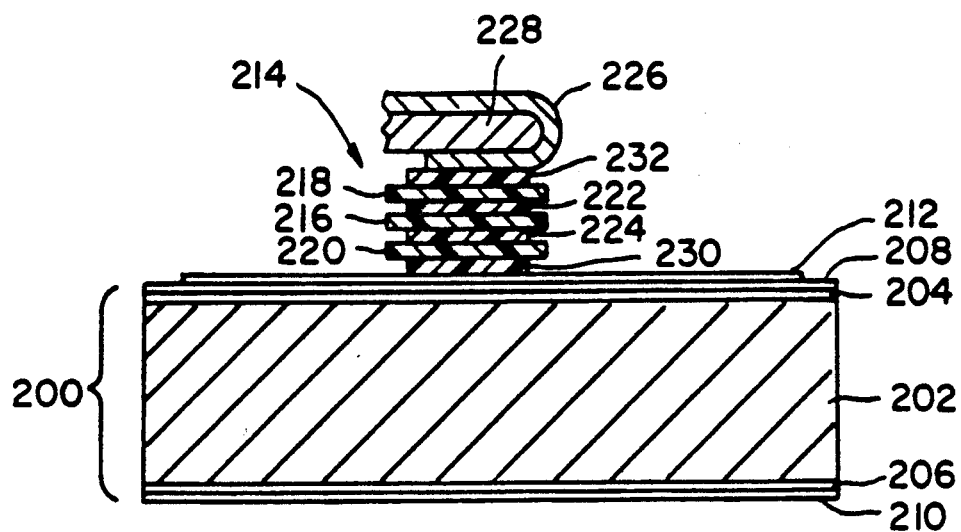
FIG. 8 is a sectional view of a substrate and a rectifier which is preferred for use with the rotating rectifier assembly.

Referring to FIG. 8, a sectional view of the substrate and the rectifiers particularly preferred for use in the rotating rectifier assembly is illustrated. The substrate 200 is a metal core ceramic coated substrate. In a preferred embodiment, a Nickel 200 metal core 202 having an approximate thickness of 4.763 mm is provided. The metal core 202 is coated on its outer surfaces by layers 204 and 206 of Alloy 214 having a preferred thickness of approximately 0.229 mm. The Alloy 214 is preferably clad to the metal core 202 is one of three ways; explosively clad, hot rolled or cold rolled. Finally, layers 208 and 210 of a ceramic material coat the substrate 200. The preferred thickness of the ceramic layers 208 and 210 is approximately 0.076 mm. One or more conductive areas 212, preferably of gold, copper or silver, having a thickness of approximately 0.051 mm. or greater is provided on top of layer 208.

A diode assembly 214 is secured to the silver layer 212. The diode assembly 214 preferably includes a layer of silicon 216 secured to molybdenum bases 218 and 220 by solder layers 222 and 224, respectively. The diode assembly 214 is preferably assembled at 310° C. using a 92.5% lead (Pb), 5.0% Indium (In), 2.5% Silver (Ag) solder in a standard soldering furnace environment.

The diode assembly is secured to the silver layer 212 at the same time it is secured to the bus bar 226 which surrounds the composite ring 228. Then solder layers 230 and 232 secure the diode assembly 214 to the silver layer 212 and the bus bar 226, respectively. The layers 230 and 232 of solder are preferably 0.127 mm. thick. They are formed at 266° C. using a 75% Pb, 25% In solder in an oxygen free environment. Note that the diode assembly 214 is secured to the substrate 202 at a temperature lower than the temperature at which the diode assembly 214 is assembled.

Figure 9:
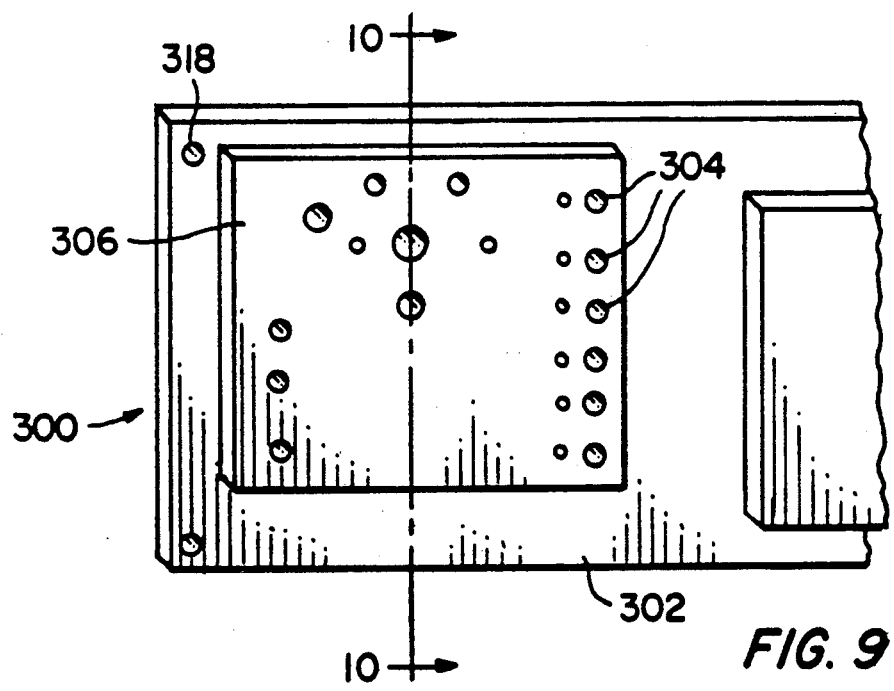
FIG. 9 is a perspective view of an embodiment of the ceramic coated substrate of the present invention.
Figure 10:
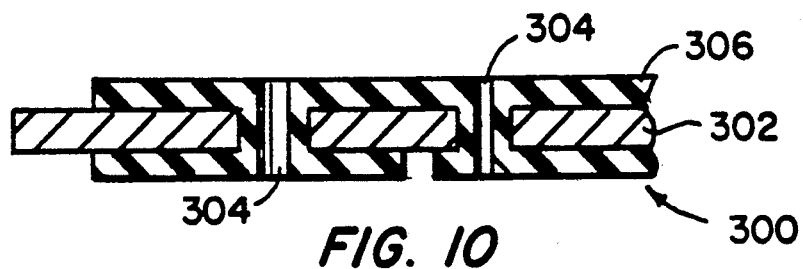
FIG. 10 is an enlarged latitudinal sectional view of the substrate of FIG. 9 taken along line 10—10.
Figure 11:
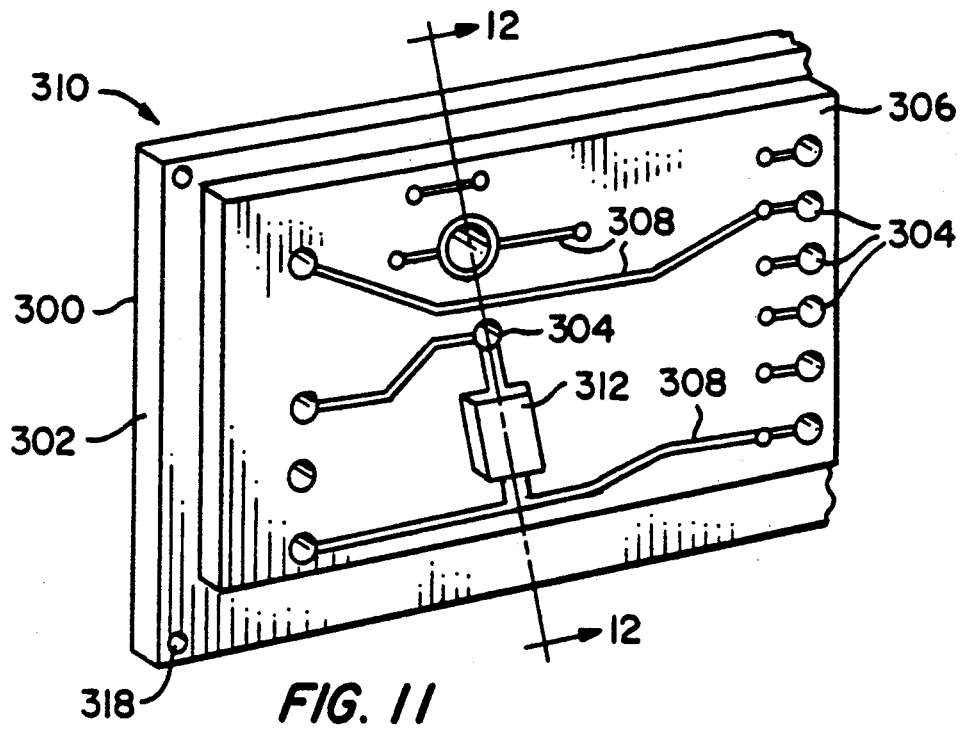
FIG. 11 is a perspective view of an embodiment of the ceramic coated substrate of this invention having an electrical circuit on the surface thereof.
Figure 12:
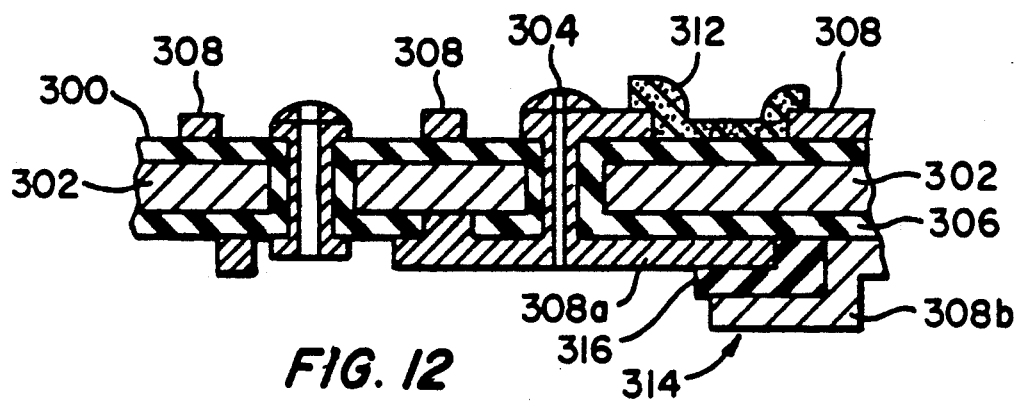
FIG. 12 is an enlarged latitudinal sectional view of the substrate of FIG. 11 taken along line 12—12.

Alternative embodiments of the substrate are discussed in U.S. Pat. No. 4,794,048, which is hereby incorporated by reference. Various alternative embodiments of the substrate will now be discussed with reference to FIGS. 9 to 12. Referring to FIGS. 9 and 10, a coated metal substrate in accordance with the present invention is indicated at 300. Substrate 300 includes a metal layer 302 having a number of through holes 304 for receipt of interconnecting devices for providing electrical connection between device 310 formed from substrate 300 and other electronic devices; substrate 300 also includes holes 318 for connecting the substrate to supporting structure (not depicted), and a non-conductive layer 306 composed of the ceramic glass of this invention heat bonded to selective portions of the top and/or bottom surfaces of metal substrate 302. In a first embodiment of the substrate depicted in to FIGS. 9 and 10, metal layer 302 consists of an elongated solid metal strip. Metal layer 302 is composed of a metal such as alloys based on nickel and iron which resist oxidation when heated at high temperature in the presence of oxygen. Preferred for use in the practice of this invention are metals which can be exposed to temperatures in excess of about 1100° C. in an oxidizing atmosphere without excessive spalling and which have thermal coefficients of expansion greater than 10 ppm/° C., and preferably 12 ppm/° C. over the temperature range of from about 50C to about 250C. Illustrative of such preferred alloys are those alloys based on cobalt, nickel, and iron and which optionally include aluminum and which preferably also include chromium. Particularly preferred metals for use in the construction of metal layer 302 are nickel based alloys as for example, the nickel alloy HAYNES alloy No. 214 available from Haynes Corporation and the iron based alloys, as for example, the iron based alloys Alfa-IV and Fecralloy available from Allegheny Ludlum Steel Corporation.

In general, the thickness of layer 302 is at least about 0.25 mm, and typically will vary from about 0.25 mm to about 25 mm. In this embodiment, layer 302 is preferably from about 0.35 mm to about 10 mm in thickness and in the particularly preferred embodiments is from about 0.5 mm to about 5 mm in thickness. Amongst these particularly preferred embodiments, most preferred are those embodiments in which the thickness of layer 302 is from about 1 mm to about 2.5 mm.

In an alternate embodiment of the invention layer 302 is a composite structure. Outer layers of the composite structure are composed of materials previously described for layer 302 and the inner layer is composed of a metal having thermal conductivity greater than that of the outer layers. The inner layer is preferably a pure metal which can be exposed to temperatures in excess of 1100° C. Illustrative of such metals are iron, chromium, cobalt, nickel, molybdenum tungsten, and beryllium. Pure nickel exhibits good thermal conductivity, processing and cost characteristics, and is especially preferred.

The composite structure of the core provides enhanced heat spreading properties, making the substrate better suited for packaging high powered electronic devices. Such a composite structure was illustrated in FIG. 8 as a preferred substrate for use with the rotating rectifier assembly of the present invention.

In constructing the core it is preferable to make the inner layer at least one order of magnitude thicker than the outer layers. Typically, each of the outer layers have thickness ranging from 0.025 mm to 0.25 mm. The thickness of the inner layer typically ranges from about 0.5 mm to 25 mm. Use of the outer layers provide a material adapted for bonding to the non-conductive layer, while the inner layer provides the core with enhanced thermal conductivity.

Non-conductive layer 306 is bonded selectively to the bottom and top surfaces of metal substrate 302 to provide the desired effect. In this invention, layer 306 is composed of a ceramic/glass composition. In general, based on the total weight of the coating of (a) from about 8 to about 26% by weight of MgO; (b) from about 10 to about 49% by weight of $Al_2O_3$; and (c) from about 42 to about 68% by weight of $SiO_2$. In the preferred embodiments of the invention, useful ceramic-glass coatings will include on an oxide basis (a) from about 9 to about 22% by weight of MgO; (b) from about 16 to about 45% by weight of $Al_2O_3$; and (c) from about 43 to about 63% by weight of $SiO_2$. In the particularly preferred embodiments of the invention, useful ceramic-glass coating will include on an oxide basis (a) from about 10 to about 18% by weight of MgO; (b) from about 23 to about 40% by weight of $Al_2O_3$; and (c) from about 44 to about 58% by weight of $SiO_2$. Amongst these particularly preferred embodiments of the invention, most preferred are those embodiments in which useful ceramic-glass coatings include (a) from about 12 to about 14% by weight of MgO; (b) from about 30 to about 35% by weight of $Al_2O_3$; and (c) from about 45 to about 52% by weight of $SiO_2$.

The glass/ceramic for use in this invention may be any one of the glass/ceramics based on ternary metal oxide systems containing varying amounts of the three components, MgO, $SiO_2$ and $Al_2O_3$. Illustrative of useful ternary metal oxide systems are cordierite ($2MgO-2Al_2O_3-5SiO_2$), sapphirine ($4MgO-5Al_2O_3-2SiO_2$) and the like. In the preferred embodiments of the invention, the glass/ceramic coating will contain varying amounts of cordierite ($2MgO-Al_2O_3-5SiO_2$) but in addition may include sapphirine ($4MgO-5Al_2O_3-2SiO_2$).

In the preferred embodiments of this the ceramic coating also includes (on an oxide basis) boron oxide and one more alkali metal or alkaline earth metal oxide, preferably an alkali earth metal oxide such as $Li_2O$, $Na_2O$ and $K_2O$ and more preferable $Li_2O$. These preferred oxide components are derived from "fluxing and sintering agents" added to the glass/ceramic during its manufacture. In the preferred embodiments of the invention, the amount of alkali metal or alkaline earth metal oxides is from about 1 to about 4 weight percent based on the total weight of $Al_2O_3$, MgO and $SiO_2$ in the composition and the amount of boron oxide is from about 3 to about 13 weight percent on the aforementioned basis. In the particularly preferred embodiments of the invention, the amount of the alkali metal or alkaline earth metal oxides is from about 1 to about 3 weight percent, and the amount of boron oxide is from about 4 to about 10 weight percent. Amongst these particularly preferred embodiments, most preferred are those embodiments in which the amount of alkali metal or alkaline earth metal oxide is from about 2 to about 3 weight percent, the amount of boron oxide is from about 5 to about 7 weight percent the amount of zinc oxide is from about 1 to about 10 weight percent.

The glass/ceramic coating may also optionally include from 0 to 11% by weight based on the total weight of $Al_2O_3$, MgO and $SiO_2$ in the composition of one or more oxides which function as nucleating agents. Illustrative of such agents are transition metal and transition earth metal oxides, such as $TiO_2$, $ZrO_2$, $Y_2O_3$, $Ta_2O_5$, $La_2O_3$ and the like. Preferred nucleating agents are $TiO_2$ and $ZrO_2$, and the most preferred nucleating agent is $TiO_2$. In the preferred embodiments of the invention, the amount of the nucleating agent is from about 2 to about 8 weight percent, based on the total weight of MgO, $Al_2O_3$ and $SiO_2$ in the composition, and in the particularly preferred embodiments of the invention, the amount of the nucleating agents is from about 4 to about 6 weight percent on the aforementioned basis.

An especially preferred coating contains cordierite ($2MgO-2Al_2O_3-5SiO_2$) and spodumene ($Li_2O-Al_2O_3-4SiO_2$), and optionally $TiO_2$ and/or sapphirine ($4MgO-5Al_2O_3-2SiO_2$). These coatings are characterized as having thermal coefficients of expansion of from about 1.9 to about 2.5 ppm/° C. over a temperature range of from about 50° C. to about 250° C.

The thickness of non-conductive layer 306 can vary widely. In general, layer 306 is from about 0.020 mm to about 0.100 mm in thickness. In the preferred embodiments of the substrate, the thickness of layer 306 is from about 0.025 mm to about 0.085 mm, and in the particularly preferred embodiments is from about 0.030 mm to about 0.070 mm. Amongst these particularly preferred embodiments of the invention, the thickness of layer 306 is from about 0.040 mm to about 0.060 mm.

As depicted in electronic device 310 of FIGS. 3 and 4, a conductive circuit Pattern 308 which is optionally applied selectively to the top and bottom of surfaces of layer 306 in such a manner to obtain the desired electronic effect. Conductive layer 308 consists of finely divided metal which has been sintered and heat bonded to the surface of non-conductive layer 306, in a desired circuit pattern. The type of metal which can be used in the construction of pattern 308 can vary widely, and can be any type of metal normally used in the formation of electrical circuits. Illustrative of useful metals are copper, nickel, palladium, platinum, silver, aluminum, gold and the like, and alloys thereof.

Thickness of pattern 308 can vary widely. Usually layer 308 has a thickness of from about 0.005 to about 0.075 mm. In the preferred embodiments of the invention, the thickness of layer 308 is from about 0.01 to about 0.06 mm, and in the particularly preferred embodiments is from about 0.015 to about 0.05 mm. Amongst these particularly preferred embodiments, most preferred are those embodiments in which the thickness of layer 308 is from about 0.02 to about 0.03 mm.

Various other components are included in the electronic device 310 depicted in FIG. 4. For example, the device includes a resistor 312 bonded to the surface of non-conductive layer 306 between two conductive paths 308. Resistor 312 can be composed of any material commonly used to form resistors, or for example, ruthenium oxide. The electronic device of FIG. 4 also includes a capacity element 314, which is a sandwich structure comprising overlapping conductive patterns 308(a) and 308(b) bonded to and sandwiching a layer 316 which is composed of finely divided dielectric material such as one or more ferroelectric materials, for example, barium titanate, lead magnesium niobate, strontium titanate, lead titanate, calcium titanate, calcium stannate, lead magnesium tungstate, barium potassium titanium niobate, calcium zirconte and sodium tantslate, either alone or in combination with one or more glasses such as silicate, borate and germanate glasses capacity element 314 can be formed by heat sintering and bonding finely divided materials very substantially the same techniques used to form later 306 and conductive pattern 308 discussed below.

The ceramic coated substrate and the electronic circuit of this invention can be manufactured through use of the process of this invention. In the first step of the process of this invention, if required, metal substrate 302 of a desired configuration is treated to remove burrs, sharp edges, and the like to facilitate later coating with the ceramic. In the preferred embodiments of the invention, the metal substrate 302 is cleaned and degreased to remove foreign materials from the surface of substrate 302. Often metal substrates contain surface inhomogeneties which manifest themselves as pits in subsequent process steps. In the preferred embodiments of the invention, the metal surface is treated to remove such surface inhomogeneties. Amongst the several techniques available for accomplishing this task, preferred are polishing, for example with sand paper, chemical etching, sand blasting and glass bead blasting. Metal substrate 302 is then heated in the presence of an oxidizing atmosphere, preferably air, at a first temperature for a time sufficient to form an amount of a metal oxide layer on one or more surfaces of said layer. The heat treatment of the metal is critical for the formation of an adherent oxide layer which forms a bonding interface for the deposited ceramic coating. The oxide layer so formed is preferably substantially homogeneous in order to prevent localized pitting or spalling. The temperature employed and the duration of the heating step will vary widely depending on the type of metal. In the preferred embodiments of the invention, metal substrate 302 is heated at a temperature of from about 800° C. to about 1250° C. for a period of from ½ to about 24 hours, and in the particularly preferred embodiments, the metal substrate is heated at a temperature of from about 1060° C. to about 1200° C. for a period of from about 1 to about 12 hours. Amongst these particularly preferred embodiments of the invention, most preferred are those embodiments in which the metal substrate is heated to a temperature of from about 1150° C. to about 1200° C. for a period of 4 to about 8 hours.

The method employed for heating metal substrate 302 is not critical and any conventional method can be used. For example, one convenient method is to heat the metal substrate at an appropriate temperature for an appropriate period of time in a box furnace which allows some air to pass in and out.

In the second step of the process of this invention, a suspension comprising one or more organic solvents, one or more heat degradable polymeric binders and a calcined mixture of finely divided glass/ceramic comprising (on an oxide basis):

from about 8 to about 26% by weight of MgO;
from about 10 to about 49% by weight of $Al_2O_3$; and
from about 42 to about 68% by weight of $SiO_2$, is applied to one or more surfaces of a metal. The types of non-conductive materials employed in the practice of this invention are as described above. The non-conductive materials are used in the form of finely divided particles. In the preferred embodiments of the invention, the materials are in the form of finely divided spherical or substantially spherical particles having an average diameter of not more than about 10 micrometers, and in the particularly preferred embodiments such materials are in the form of finely divided spherical or substantially spherical particles having an average diameter of less than about 5 micrometers. Amongst these particularly preferred embodiments most preferred are those embodiments in which non-conductive materials are in the form of finely divided spherical or substantially spherical particles in which the average particle diameter is less than about 2 micrometers.

"Thermally degradable polymeric organic binders" are one component of the suspension which is applied to the substrate in step two. As used herein "thermally degradable polymeric organic binders" are naturally occurring or synthetic polymers which degrade when subjected to heat. Useful thermally degradable polymeric organic binders for use in this invention are also not critical and can also vary widely. Organic polymer binders for use in the practice of this invention preferably are capable of providing a stable colloidal suspension with the one or more non-conducting materials and one or more organic solvents, and is preferably thermally degradable when heated at temperature of at least about 300° C., and most preferably at a temperature from about 300° C. to about 600° C. to leave a substantially uniform packed coating of the finely divided non-conductive material bonded to one or more surfaces of the metal. Polymers which do not substantially completely thermally degrade or which leave decomposition products which interfere with the insulating capability of the dielectric are not preferred for use. In general, any naturally occurring or synthetic polymeric or elastomeric material can be used. Illustrative of such useful polymers are, unsaturated olefins such as polyvinyl alcohol, polyacrylates, polypropylene, polymethacrylates, polyvinyl chloride, polyethylene, and the like; polyethers; polyesters such as polyethylene terephthalate, polybutylene terephthalate and the like; polyamides such as nylon-11, nylon-12, nylon-6, nylon-66 and the like; polysulfones; polyphenylene oxides; cellulose based polymers, such as methyl cellulose ethers, ethylpropyl cellulose ethers and hydroxypropyl cellulose ethers; and the like.

Another component of the suspension applied to the substrate in step two is one or more organic solvents. Organic solvents used to form the suspensions are not critical, and can vary widely. The only requirement is that the solvents are capable of dissolving the thermally degradable polymeric organic binders and capable of dispersing the one or more finely divided non-conductive materials so as to form a colloidal suspension or dispersion. In the preferred embodiments of the invention, organic solvents are those which volatilize when heated to a temperature of from about 50° C. to about 250° C. at atmospheric pressure, and in the particularly preferred embodiments organic solvents are those which volatilize when heated to a temperature of from about 75° C. to about 150° C. at atmospheric pressure. Amongst these particularly preferred embodiments most preferred are those organic solvents which volatilize when heated to a temperature of from about 90° C. to about 120° C. at atmospheric pressure. Illustrative of useful solvents are alcohols, esters, ketones, aldehydes, hydrocarbons and like organic solvents.

The last component of the suspension applied to the substrate in step two is a mixture of calcined glass-/ceramics. The calcined glass/ceramic mixture is formed by forming a mixture of finely divided $Al_2O_3$, $SiO_2$ and MgO in the above-referenced proportions, together with one or more "effective fluxing and sintering agents" and optionally one or more "effective nucleating agents". As used herein, "effective fluxing and sintering agents" are fluxing and sintering agents which are effective to increase the adhesion of the ceramic glass to the metal substrate to any extent. These agents are precursor materials for the alkaline earth metal and/or alkali metal oxides, or boron oxide contained in the coating. Illustrative of effective fluxing and sintering agents are alkali metal salts such as $LiBO_2$, $ZnO/B_2O_3$, $Li_2O$, ZnO, $B_2O_3$, $Li_2B_4O_7$, $Na_2O$, $NaBO_2$, $Li_4B_6O_{11}$, $K_2O$, CaO, LiF, NaF, LiCl, NaCl, $Na_2SiF_6$, $Na_2B_4O_7$, $4CaO.5B_2O_3.9H_2O$, $LiAlSi_3O_8$, $Li_2Si_2O_5$, $BaB_2O_4$ and the like. Preferred effective fluxing and sintering agents are alkali metal borates, meta-borates and like borates such as $LiBo_2$, $ZnO/B_2O_3$, $Li_2B_4O_7$, $Li_2Si_2O_5$, LiF, $BaB_2O_4$, and $4CaO5B_2O_39H_2O$. Particularly preferred effective fluxing and sintering agents are lithium borates, zinc borates and metaborates. Amongst these particularly preferred effective fluxing and sintering agents are $LiBo_2$, $Li_2B_4O_7$ and LiF.

The amount of fluxing and sintering agents can vary widely. The amount of fluxing and sintering agents will depend on the amount of alkaline earth and/or alkali metal oxides, and boron oxides desired in the glass-/ceramic composition. In general, the amount of such agents is from about 1 to about 15% based on the total weight of $Al_2O_3$, MgO and $SiO_2$ in the composition. In the preferred embodiments of the invention, the amount of fluxing and sintering agents is from about 5 to about 12 weight percent based on the total weight of $Al_2O_3$, MgO and $SiO_2$ in the composition, and in the particularly preferred embodiments of the invention the amount of fluxing and sintering agents is from about 7 to about 9 on the aforementioned basis. Partial substitution of $LiBO_2$ with $ZnO/B_2O_3$ limits reaction between $LiBO_2$ and the protective oxide on the metal substrate, thereby preventing such dissolution of the protective oxide coating which may expose any portion of the metal substrate to the flux. A superior deilectric coating having virtually no pinholes and minimal discoloration is thereby produced. Advantageously, with this partial substitution the firing time required for sintering of the ceramic coating is much less critical. Firing times formerly restricted to about 1–15 minutes can be extended over a broader time period (typically about 1–30 minutes and more), and firing temperature can be increased by as much as 50° C. Such expanded firing time and temperature parameters widen the processability window, facilitating scaled up production of the ceramic metal substrates. As a result, the fluxing and sintering agen comprised of $LiBO_2$ partially substituted with $ZnO/B_2O_3$ is especially preferred.

As used herein, "effective nucleating agents" are nucleating agents which promote the crystallization of residua glass phases. Illustrative of such nucleating agents are metal oxides such as $TiO_2$, $ZrO_2$, $Y_2O_3$, $Ta_2O_5$ and $La_2O_3$. Preferred nucleating agents are $TiO_2$ and $ZrO_2$, and a particularly preferred nucleating agent is $TiO_2$.

The effective nucleating agents are optional when used, and the amount thereof may vary widely. In general, the amount of such agents can vary from about 0 to about 11% by weight based on the total weight of $Al_2O_3$, MgO and $SiO_2$ in the composition. In the preferred embodiments of the invention, the amount of effective nucleating agents is from 2 to about 8 weight percent based on the total weight of MgO, $Al_2O_3$ and $SiO_2$ in the composition, and in the particularly preferred embodiments of the invention. The amount of effective nucleating agents is from about 4 to about 6 weight percent based on aforementioned basis.

Preparation of the calcine glass/ceramic mixture involves well known procedures. The raw materials are weighed and combined according to the desired proportions. The raw materials can be added as pure oxides, or alternatively, in equivalent forms containing volatile species which are eliminated during subsequent heating. For example, magnesium carbonate can be used in place of magnesium oxide, or boric acid can be used in place of boron oxide. Similarly, the lithium oxide, zinc oxide and boron oxide can be conveniently added in a precombined form such as $LiBO_2$, $Li_2B_4O_7$, or $ZnO/B_2O_3$. The raw materials are thoroughly mixed, typically by wet milling in a ball mill with added solvent, such as isopropanol in an amount sufficient to form a slurry of the desired proportion of ingredients.

After filtering and drying to form a powder the materials are calcined in order to produce the desired glass-/ceramic composition. Calcination may be carried out using conventional procedures. For example, this process may be carried out in a box furnace with a slow heat up to allow for removal of any residual volatiles. Peak temperatures may vary, typically being in the range from about 1100° C. to about 1300° C., and time at peak temperature may also vary, typically ranging from about 2 to about 20 hours. The resultant product is then pulverized and ball milled in an appropriate solvent such as isopropanol using standard ceramic processing equipment to produce particles nominally less than about 10 microns in diameter. This slurry is then filtered and dried to produce the fine powder which will subsequently be applied to a metal core together with one or more binders and organic solvents.

The amounts of the various ingredients in the suspension employed in the first step of the process of this invention can vary widely. Very dilute suspensions can be made for electrophoretic deposition and more concentrated suspensions for spraying, roller coating and the like. The preferred method in accordance with this invention is to make a high viscosity phase which is deposited in a screen printing process. The paste can be made with a variety of materials typical in the thick film industry. An illustrative formulation is a mixture of 65 weight percent ceramic powder combined with an organic vehicle containing ethyl cellulose dissolved in a high molecular weight alcohol. In general, the lower the concentration of suspended non-conductive materials in the suspension the more often the suspension must be applied to the metal to provide a given thickness of such bonded/sintered non-conductive material in the final glass-ceramic coated substrate; and conversely, the higher the concentration of suspended non-conductive materials in the suspension, the less often the suspension must be applied to the metal to provide a given thickness of bonded/sintered non-conductive material in the glass-ceramic coated substrate. In general, the concentration of organic solvents in the suspension will vary from about 5 to about 50 weight percent, the concentration of the non-conductive materials in the suspension will vary from about 40 to about 85 weight percent, and the concentration of polymeric binders in the suspension will vary from about 1 to about 15 weight percent based on the total weight of the suspension. In the preferred embodiments of the invention, the concentration of organic solvents in the suspension will vary from about 10 to about 45 weight percent, the concentration of non-conductive materials in the suspension will vary from about 45 to about 80 weight percent, and the concentration of polymeric binders in the suspension will vary from about 1 to about 10 weight percent. In the particularly preferred embodiments, the concentration of organic solvents in the suspension is from about 20 to about 40 weight percent, to concentration of non-conductive materials in the suspension is from about 50 to about 75 weight percent suspension is from about 1 to about 5 weight percent. All weight percents are based on the total weight of the suspension.

The suspension is applied to one or more surfaces of the metal in a predetermined pattern. The suspension can be applied over all of the surfaces or over a portion thereof. Any suitable technique useful for applying a suspension to the surface of a solid material can be used. Illustrative of useful techniques are screen printing, pad printing, dipping, spraying and the like. Such techniques of applying suspensions to a substrate are well known in the art and will not be described herein in great detail. Application by use of screen printing is preferred in accordance with this invention because of the ease with which patterns can be generated which allow open areas for mounting holes, ground plane interconnects, and electrically isolated vias from one side to the other. Typically, the pattern is printed on both sides of the metal in order to maintain uniform stress and eliminate bowing.

The suspension can be applied in a single application or multiple applications can be made depending on the desired thickness of the layer of non-conductive material in the finished product. In the preferred embodiments there are from 1 to about 6 printed layers depending on the desired thickness and in the most preferred embodiments of the invention only about 2 to about 3 layers. In some instances it is preferred that the final top layer ceramic composition differ from the underlying layer or layers. In this way one can take advantage of those ceramic compositions with superior adhesive properties for direct contact to the metal core and those compositions with superior electrical properties for contact with the overlying circuitry.

The amount of the suspension applied to the metal at any particular situs will vary widely depending on the desired thickness of the non-conductive material in the final glass-ceramic coated substrate. The amount of the suspension applied to the metal is sufficient, usually, to provide a layer of sintered non-conductive material bonded to the metal of a thickness of at least about 20 microns. In the preferred embodiments of the invention, the amount applied is sufficient to provide a layer of non-conductive material having a thickness of from about 25 microns to about 85 microns, and in the particularly preferred embodiments, the amount applied is sufficient to provide a layer of non-conductive material having a thickness of from about 30 microns to about 70 microns. Amongst these particularly preferred embodiments of this invention, most preferred are those embodiments in which the amount of suspension applied to the metal is sufficient to provide a layer of sintered non-conductive material bonded to the metal having a thickness of from about 40 microns to about 60 microns.

In the third step of the process of this invention, the metal to which the suspension has been applied in the desired predetermined pattern and in the desired amount heated at a temperature and for a time sufficient to remove substantially all of the organic solvent from the applied suspension and to sinter the non-conductive material, and to bond the sintered material to the metal substrate or substrates as the case may be and to crystallize the residual glassy phase of the non-conductive material. The firing procedure is important in that it determines the degree of adhesion and structure of the ceramic coating. The article is preferably placed in a room temperature furnace which is subsequently programmed for a given temperature and time profile. In the preferred embodiments of the invention, the heating step is divided into two portions and has at least two plateaus. In these preferred embodiments, the metal substrate to which the suspension has been applied is first heated to a temperature sufficient to volatilize the solvents from the suspension, preferably in less than about one hour without disturbing the integrity of the remaining composition to form a coating of a composition containing essentially no solvent and which comprises the finely divided non-conductive material and the binders coated on the surface of the substrate in the predetermined pattern. The purpose of this step is to ensure complete volatilization of the polymer binder so that preferably substantially no carbon containing residual is present. The heating step can be carried out in an air atmosphere, or in an atmosphere of non-oxidizing gas. Obviously, this heating temperature can vary widely depending on the volatilization temperature of the particular solvent or solvents employed. Usually, however, the heating step is carried out at a temperature equal to or less than about 200° C. for a period equal to or less than about 4 hours. In the preferred embodiments using preferred solvents, this heating step is carried out at a temperature of from about 50° C. to about 200° C. at atmospheric pressure for a period equal to or less than about 2 hours, and in the particularly preferred embodiments of the invention using particularly preferred solvents at a temperature of from about 75° C. to about 150° C. at atmospheric pressure for a period equal to or less than about 1 hour. In the most preferred embodiments of the invention employing most preferred solvents, the first part of the heating step is carried out at a temperature of from about 90° C. to about 120° C. at atmospheric pressure for a period equal to or less than about 0.5 hour.

In the second step of the split heating procedure, the metal and coated composition from which the solvents have been substantially removed are heated at a temperature and for a time sufficient to degrade substantially all of the polymer organic binders in the composition and sinter the finely divided non-conductive material and bond same to one or more surfaces of the metal as the case may be, to produce a substantially uniform coating of finely divided non-conductive material on one or more surfaces of the metal. The heating temperature employed in the second part of the split heating step can vary widely and will depend on the particular polymer binders, non-conductive materials and metals employed and the temperature employed in the substrate heating step.

Polymer degrading and sintering can be carried out in a single step or in multiple steps. Preferably, polymer degrading and sintering are carried in two steps. In the first step, the polymer is degraded In this step, the coated substrate from which solvent has been removed is heated at a temperature and for a time sufficient to degrade the polymer Usually, this heating step is carried out at a temperature equal to or greater than about 200° C. for a period equal to or less than about 4 hours. In the preferred embodiments using preferred polymers, the polymer degrading step is carried out at a temperature of from about 200° C. to about 800° C. for a period equal to or less than about 2 hours and in the particularly preferred embodiments using particularly preferred polymers is carried out at a temperature of from about 300° C. to about 700° C. for a period equal to or less than about 1 hour. In the most preferred embodiments of the invention employing most preferred polymers, the polymer degrading heating step is carried out at a temperature of from about 400° C. to about 600° C. for a period equal to or less than about 0.5 hour.

After the polymer has been degraded to the desired extent, the coated substrate is then heated at a temperature and for a time sufficient to sinter the finely-divided non-conductive material and bond same to the surface of the metal substrate. In general, the coated substrate is heated at a temperature below the melting point of the metal of the substrate for a period equal to or less than about 2 hours to sinter and bond the non-conductive material to the substrate. In the preferred embodiments of the invention, the coated substrate is heated at a temperature from about 1000° C. to about 1220° C. for a period equal to or less than 1 hour, and in the particularly preferred embodiments of the invention, the coated substrate is heated at a temperature of from about 1060° C. to about 1200° C. for a period equal to or less than 0.5 hour. Amongst these particularly preferred embodiments, most preferred are those embodiments in which the coated substrate is heated at a temperature of from about 1150° C. to about 1200° C. for a period equal to or less than 30 minutes. Subsequent cool down is not critical and the natural cooling rate of the unpowered furnace is generally adequate.

During sintering, some vitrification of the glass/ceramic may occur. This residual glass structure is not desirable and can be substantially eliminated by a final heat treatment. In this heat treatment step, the coated metal substrate is heated to a temperature and for a time sufficient to crystallize the residual glassy phase to the desired extent. Heating temperatures and times may vary widely depending on the nature of the components of the coating. This procedure can be carried out in a single step or in multiple steps. In the preferred embodiment of the invention, the procedure is carried out in two steps. In the first step, the coated metal substrate is usually heated to a temperature of from about 600° C. to about 900° C. for a period equal to or less than about 1 hour. In the preferred embodiments of the invention, the substrate is heated to a temperature from about 650° C. to about 850° C. for a period equal to or less than about 0.5 hour, and in the most preferred embodiments of the invention, the coated substrate is heated for a period equal to or less than about 15 minutes at a temperature of from about 700° C. to about 800° C. In the second step of this split heating step, the coated substrate is heated at a temperature of from about 800° C. to about 1100° C. over a period of from about 1 to about 6 hours. In the preferred embodiments of the invention, the heating temperature is from about 800° C. to about 1050° C. and the heating period is from about 1 to about 6; and in the particularly preferred embodiments of the invention, heating temperatures are from about 850° C. to about 1000° C. and heating times are from about 1 to about 4 hours. Amongst these particularly preferred embodiments of this invention, most preferred are those embodiments in which heating temperatures of from about 900° C. to about 950° C. and heating times of from about 1 to about 3 hours are employed.

The substrate so formed can be used to form electronic substrates. For example, suspension of a finely divided metal, as for example, the metal used as the solid metal substrate, such as copper, silver, gold aluminum, palladium, platinum and the like and alloys thereof, and containing one or more organic solvents having one or more polymeric binders dissolved herein is applied to surface of the sintered and bonded non-conductive material. The combination is thereafter heated to volatilize substantially all of the solvents from the suspension and to degrade substantially all of the binders, thereby sintering the finely divided metal and bonding said sintered metal to the surface of the non-conductive material. The suspension can be applied to one or more surfaces of sintered and bonded non-conductive material in a predetermined pattern. The suspension can be applied over all of the surfaces or a portion thereof using the same techniques employed in the suspension application step 1. The suspension can be applied in a single application or multiple applications can be made, depending on the desired thickness of the layer of metal in the finished electronic device. The components and the relative amounts of the components of the suspension are as used in the suspension of step 1.

In an alternative embodiment of the process of this invention, the combination of the metal and coated composition are used directly in the third step of the process. In this procedure, the thermal degradation of the binders, and the sintering and heat bonding of both the sintered non-conductive layer and the sintered metal layer are accomplished in a single high temperature second part of the split heating step.

The solvent volatilization, polymer degradation, and sintering procedures used in this step are essentially the same as used in step two of the process of this invention in heating the suspension of the non-conductive material to remove the solvents, degrading the polymers kinds, and sintering and bonding the resulting composition to the surface of the solid conductive material As in the case of the earlier heating step 2, the heating step of this procedure is preferably carried out in two stages. In the first stage of the heating procedure, the applied suspension is heated to a temperature and for a time which is sufficient to volatilize the one or more solvents from the applied suspension. In the second stage of the heating procedure, the substrate coated with the dried suspension is heated at a temperature and for a time which is sufficient to sinter the finely divided metal and bond the sintered metal to the surface of the non-conductive layer In the case of the alternative embodiment of the process of this invention, the coated substrate is also heated to a temperature and for a time sufficient to sinter the finely divided non-conductive material and bond the material to the surface of the metal substrate Usually in the case of the alternative embodiment, the coating of the finely divided metal and the coating of the non-conductive material are sintered and bonded using substantially the same heating conditions.

The thickness of the conductive layer is not critical and can vary widely. Usually, the layer has a thickness of from about 0.005 to about 0.075 mm. In the preferred embodiments of the invention, the conductive layer has a thickness of from about 0.01 to about 0.06 mm, and in the particularly preferred embodiments of the invention has a thickness of from about 0.015 to about 0.05 mm. Amongst these particularly preferred embodiments most preferred are those embodiments in which the conductive layer has a thickness of from about 0.02 to about 0.03 mm.

The process of this invention can be used to manufacture electronic devices of this invention. Such devices vary widely and include circuit board, capacitors and the like. The process is preferred for use in the manufacture of circuit boards.

The following specific examples are present to more particularly illustrate the invention and are not intended to limit the scope of the invention.

EXAMPLES 1 TO 18

General Procedure

A mixture of MgO, $Al_2O_3$, and $SiO_2$, close to stoichiometric ratio of 2:2:5 (cordierite) and about 4–10 wt % of $Li_2O$–$B_2O_3$ with 0–10 wt % $TiO_2$ is ball milled in isopropanol to insure proper mixing and melt homogeneity. The slurry is then filtered, dried and calcined at 1100–1300C for 4–12 hours. The solid product is then pulverized to form the compositions set forth in the following Table I.

TABLE I

| Composition No. | Weight | | | | | | |
|---|---|---|---|---|---|---|---|
| | MgO | $Al_2O_3$ | $SiO_2$ | $Li_2O$ | $B_2O_3$ | $TiO_2$ | ZnO |
| 1 | 12.5 | 31.7 | 46.7 | 2.7 | 6.3 | 0.0 | 0.0 |
| 2 | 12.4 | 31.4 | 46.2 | 3.0 | 7.0 | 0.0 | 0.0 |
| 3 | 12.5 | 31.7 | 46.7 | 1.6 | 7.4 | 0.0 | 0.0 |
| 4 | 12.4 | 31.4 | 46.2 | 1.8 | 8.2 | 0.0 | 0.0 |
| 5 | 11.7 | 29.6 | 43.7 | 2.7 | 12.3 | 0.0 | 0.0 |
| 6 | 12.5 | 32.0 | 47.0 | 2.6 | 5.9 | 0.0 | 0.0 |
| 7 | 9.7 | 47.6 | 36.2 | 2.0 | 4.5 | 0.0 | 0.0 |
| 8 | 22.7 | 20.0 | 45.4 | 2.4 | 5.5 | 4.0 | 0.0 |
| 9 | 12.0 | 30.5 | 45.0 | 2.4 | 5.6 | 4.5 | 0.0 |

TABLE I-continued

| Composition No. | Weight | | | | | | |
|---|---|---|---|---|---|---|---|
| | MgO | $Al_2O_3$ | $SiO_2$ | $Li_2O$ | $B_2O_3$ | $TiO_2$ | ZnO |
| 10 | 12.3 | 31.2 | 45.9 | 1.8 | 4.2 | 4.6 | 0.0 |
| 11 | 22.7 | 19.1 | 45.2 | 2.4 | 5.6 | 5.0 | 0.0 |
| 12 | 11.2 | 28.3 | 41.7 | 2.5 | 5.8 | 10.5 | 0.0 |
| 13 | 12.0 | 30.2 | 44.5 | 0.0 | 3.6 | 4.4 | 5.3 |
| 14 | 11.0 | 27.6 | 40.7 | 1.1 | 4.6 | 4.5 | 10.0 |
| 15 | 14.8 | 24.3 | 47.5 | 1.1 | 4.6 | 4.5 | 3.2 |
| 16 | 16.0 | 25.0 | 45.0 | 1.1 | 4.7 | 5.0 | 3.2 |
| 17 | 16.8 | 26.3 | 50.5 | 1.2 | 5.0 | 0.0 | 3.2 |
| 18 | 17.2 | 24.3 | 47.5 | 1.4 | 5.8 | 0.0 | 3.8 |

The pulverized product can be blended with a suitable organic vehicle to form a printable paste.

The substrate was a nickel alloy (214 Haynes Corporation). The surface of this alloy is first chemically etched for at least 30 minutes, bead blasted for initial oxide removal, followed by heat treatment at a temperature at which the final product (coated substrate) is fired. This step provides an oxide layer which enhances the bonding between the metal and coating. This also prevents diffusion of metal into the coating, causing discoloration. After surface preparation, the metal is coated with the ceramic paste via screen printing. The printed substrates are allowed to settle at room temperature for 15–20 minutes followed by drying at 120° C. for 30–45 minutes. The dried samples are then fired in air at 1140–1300° C. for 1–15 minutes. The fired products can either be quenched at room temperature or allowed to cool slowly at the furnace cooling rate (ca. 40° C./minute). The final step in this process is heat treatment of the final products at 750–1000° C. for 2–24 hours to crystallize the residual glassy phase. The following Table II sets forth the processes and materials which produce good adhesion between the ceramic and metal.

TABLE II

Examples of Ceramic Coated Metal Composites
(The metal was chemically etched or sanded)

| | | Metal Preparation Process | | | Firing Conditions | |
|---|---|---|---|---|---|---|
| | | Heat Treatment in Air | | | Peak | |
| Example No. | Initial Oxide Removal | Temp (°C.) | Time (hrs) | Ceramic Comp. | Temp (°C.) | Time (min) |
| 1 | $FeCl_3$/HCl Etch | 800 | 0.5 | 1 | 1150 | 20 |
| 2 | $FeCl_3$/HCl Etch | 800 | 0.5 | 1 | 1300 | 1 |
| 3 | $FeCl_3$/HCl Etch | 800 | 0.5 | 2 | 1300 | 1 |
| 4 | $FeCl_3$/HCl Etch | 800 | 0.5 | 3 | 1300 | 1 |
| 5 | $FeCl_3$/HCl Etch | 800 | 0.5 | 4 | 1300 | 1 |
| 6 | $FeCl_3$/HCl Etch | 800 | 0.5 | 5 | 1150 | 1 |
| 7 | $H_2SO_4$/HCl Etch | 1200 | 0.5 | 7 | 1250 | 2 |
| 8 | $H_2SO_4$/HCl Etch | 1200 | 0.5 | 7 | 1275 | 2 |
| 9 | $H_2SO_4$/HCl Etch | 1200 | 0.5 | 8 | 1200 | 2 |
| 10 | $H_2SO_4$/HCl Etch | 1200 | 0.5 | 8 | 1225 | 2 |
| 11 | $H_2SO_4$/HCl Etch | 1200 | 0.5 | 8 | 1250 | 2 |
| 12 | $H_2SO_4$/HCl Etch | 1200 | 0.5 | 9 | 1200 | 2 |
| 13 | $H_2SO_4$/HCl Etch | 1200 | 0.5 | 9 | 1225 | 2 |
| 14 | $H_2SO_4$/HCl Etch | 1200 | 0.5 | 9 | 1250 | 2 |
| 15 | $H_2SO_4$/HCl Etch | 1200 | 0.5 | 10 | 1225 | 2 |
| 16 | $H_2SO_4$/HCl Etch | 1200 | 0.5 | 12 | 1200 | 2 |
| 17 | $H_2SO_4$/HCl Etch | 1220 | 0.25 | 11 | 1175 | 2 |
| 18 | Sand, 400 grit | 1150 | 8 | 9 | 1160 | 10 |

EXAMPLE 19

Aggalloy was degreased and heat treated in air for 45 minutes at 1200° C. to build up an oxide layer. The metal was then printed with a paste containing dielectric composition 9, dried, fired at 1175° C. for three minutes, and then heat treated at 900° C. for two hours. The resultant ceramic had very good adhesion to the metal.

EXAMPLE 20

The identical dielectric and process procedure of Example 19 was used with Fecralloy as the supporting metal. Again, there was very good adhesion of ceramic to metal.

EXAMPLE 21

Alloy 214 was etched in $H_2SO_4/HCl$ for 30 minutes to remove the oxide surface from as-received metal. It was then heat treated in air at 1200° C./for 30 minutes. Dielectric composition number 9 was printed with two layers on each side of the metal. This was then followed by dielectric composition 6 printed in one layer on each side. The parts were fired at 1180° C. for two minutes in a tube furnace followed by heat treatment at 900° C. for 15 minutes in a box furnace.

Thick film Pd/Ag conductors were printed and fired (850° C./10 minutes) on these parts to determine electrical properties of the ceramic dielectric.

The parts wee then subjected to repetitive thermal shock cycling as per MIL-STD-883C, Method 1011.5B between 125° C. and −55° C. liquid heat sinks. Results are set forth in the following Table III.

TABLE III

| Parameter | Initial | After 150 cycles |
|---|---|---|
| Resistivity (ohm-cm) | $7.3 \times 10^{13}$ | $6.9 \times 10^{13}$ |
| Dielectric Constant (1MHz) | 6.5 | 6.7 |
| Dissipation Factor (1MHz) | 0.0060 | 0.0062 |

Despite the large TCE difference (metal = 13.3, ceramic = 2.3), no catastrophic failure was detected.

EXAMPLE 22

A series of tests were carried out to compare the substrate of Example 21 to alumina with regard to adhesion and conductivity of commercially available hybrid thick film materials applied to the surface of the ceramic using a selection of conductive inks. Although applications for thick film on $Al_2O_3$ are limited due to relatively complex (and costly) packaging schemes needed for mechanical fastening and to protect the fragile alumina from mechanical stress caused by shock, vibration and TCE mismatch, $Al_2O_3$ was selected for evaluation because of its superior electronic properties.

Materials from several thick film paste suppliers were printed on the substrate of Example 21 and compared to results on $Al_2O_3$. The test samples were screened on an MPM TF-100 Printer and fired in a BTU furnace with standard commercial 850° C. profile. The Alumina substrates were Coors 96% material.

Adhesion tests were performed on the four metallizations using the procedure described in DuPont technical literature (80 mil squares) using an Instron model 1123. Conductivity of the four metallizations was measured using a 500 Square serpentine pattern 0.010" wide.

Results of the study are shown in Table IV.

In the Table IV, the abbreviations have the following meanings:

(a) "ESL 9633B" is Ag/Pd pasted manufactured and sold by ESL Corporation.

(b) "EMCA C3325" is Ag/Pd pasted manufactured and sold by EMCA Corporation.

(c) "DuPont 9770" is Ag/Pd pasted manufactured and sold by Dupont Company.

(d) Engelhard A3058" is Ag/Pd pasted manufactured and sold by Englehard corporation.

(e) "CCM" is the glass/ceramic coated substrate of EXAMPLE 21.

TABLE IV

Properties of Thick Film Conductors Fired at 850° C. for 10 minutes

| | Adhesion (lbs/0.080" square) | | | |
|---|---|---|---|---|
| | Initial | | After 24 hrs @ 150° C. | |
| Conductor | CCM | $Al_2O_3$ | CCM | $Al_2O_3$ |
| ESL 9633B | 5.4 | 5.9 | 4.0 | 4.3 |
| EMCA C3325 | 4.8 | 5.7 | 2.0 | 5.4 |
| DuPont 9770 | 6.1 | 5.9 | 3.0 | 3.0 |
| Engelhard A3058 | 4.2 | 5.5 | 1.4 | 1.7 |

| | Conductivity (Siemens/square) | |
|---|---|---|
| Conductor | CCM | $Al_2O_3$ |
| ESL 9633B | 13 | 21 |
| EMCA C3325 | 15 | 27 |
| DuPont 9770 | 120 | 240 |
| Engelhard A3058 | 120 | 150 |

In general, the range of conductivities available on the EXAMPLE 21 system overlaps quite well with alumina for the materials tested, and any reduced disadvantages attendant to conductivities are more than offset by the superior mechanical properties of the EXAMPLE 21 substrate.

The results of Table IV show that for initial adhesion the adhesion properties of the Comp 2 substrate are comparable to those of alumina. One substrate which was initially comparable to alumina by weakened after aging at 150C. However, the final level achieved was still better than the worst case on alumina with another material.

EXAMPLES 23-30

The procedure of EXAMPLES 1-18 was repeated, except that, instead of chemical etching or sanding, the surface of Alloy 214 was blast cleaned by glass beads, then heat treated in air using the time/temperature profiles provided in table V. The procedure employed in surface preparation and coating for EXAMPLES 23-30 is set forth below.

Both sides of 2"×2" pieces of alloy 214 were blast cleaned for about 2 minutes by glass beads having 1 100-200 diameter and blasting pressure of about 60-90 psi. This process effected removal of 4-6 microns from the surface of each side of the metal. The parts were then cleaned by sequential sonication in detergent/water solution, tap water, deionized water and finally methanol. Each sonication cycle was conducted for 10 minutes at an operating temperature of 50° C. The parts were then heat treated in air according to Table V, and cleaned by repeating the above cleaning steps. Dielectric number 15 was printed with two layers on each side of the metal. This was then followed by dielectric composition 18, printed in one layer on each side. The parts were fired in a programmable box furnace at 1170° C. for five minutes, followed by nucleation at 750° C. for 45 minutes and crystallization at 900° C. for 45 minutes. Parts prepared employing the procedure described in this example showed good adhesion, no discoloration and no pinholes.

TABLE V

METAL PREPARATION PROCESS

| Example No. | Initial Oxide Removal | Heat Treatment in Air Temp (°C.) | Time (hrs) | Ceramic Comp. Top/Bottom |
| --- | --- | --- | --- | --- |
| 23 | glass bead blasting | 1100 | 4 | 18/15 |
| 24 | glass bead blasting | 1100 | 8 | 18/15 |
| 25 | glass bead blasting | 1160 | 4 | 18/15 |
| 26 | glass bead blasting | 1160 | 6 | 18/15 |
| 27 | glass bead blasting | 1160 | 8 | 18/15 |
| 28 | glass bead blasting | 1120 | 4 | 18/15 |
| 29 | glass bead blasting | 1200 | 6 | 18/15 |
| 30 | glass bead blasting | 1200 | 8 | 18/15 |

| Example No. | Temp (°C.) | Firing Conditions Peak Time (min) | Rank* |
| --- | --- | --- | --- |
| 23 | 1170 | 5 | 2 |
| 24 | 1170 | 5 | 3 |
| 25 | 1170 | 5 | 3 |
| 26 | 1170 | 5 | 4 |
| 27 | 1170 | 5 | 5 |
| 28 | 1170 | 5 | 5 |
| 29 | 1170 | 5 | 5 |
| 30 | 1170 | 5 | 5 |

*All the parts prepared according to Table V showed excellent adhesion between the ceramic coating and the metal with virtually no pinholes. The parts have been ranked from 1 (discolored) to 5 (no discoloration). The combination of bead blasting/heat treating produced surfaces with superior uniformity and significant improvement in the ceramic to metal adhesion. The bead blasting/heat treating process also eliminated the problems associated with batch to batch variation of the core metal.

EXAMPLE 31

In packaging high power devices which require efficient removal of heat from the semiconductor, it is possible to enhance the thermal conductivity of the substrate. In this example, this was accomplished by replacing approximately 0.56 mm of Alloy 214 with 4.8 mm of nickel 200. The following table of calculated properties shown the improved performance achievable.

| | Thermal conductivity (W/cm- C) | |
| --- | --- | --- |
| | z axis | x,y axis |
| Standard Construction | 0.066 | 0.09 |
| 0.076 mm ceramic on both sides of 1.106 mm alloy 214 | | |
| Enhanced Construction | 0.29 | 0.67 |
| 0.076 mm ceramic | | |
| 0.229 mm alloy 214 | | |
| 4.763 mm nickel 200 | | |
| 0.299 mm alloy 214 | | |
| 0.076 mm ceramic | | |
| Bulk Material | | |
| Ceramic | | 0.02 |
| Alloy 214 | | 0.1 |
| Nickel 200 | | 0.75 |

The enhanced construction metal core was made in this example by explosively cladding the materials together, but other techniques, such as rolling, are available. All other processes for pretreating the metal, coating the ceramic, and firing are as previously disclosed. The absolute thermal conductivity of this construction was not measured, but in a specific use application (with deposited circuitry and high power semiconductor devices) the measured temperature differentials were as predicted by the data above. Specifically, a calculated thermal resistance of 3.9 /W (for the enhanced construction) was found experimentally to be actually somewhat lower at 3.5 /W, thus verifying the potential performance improvements.

We claim:

1. A rotating rectifier assembly in an electric machine for rectifying an ac signal generated by windings in a exciter rotor disposed about a rotatable shaft for rotation therewith, comprising:
   a substrate disposed about the shaft for rotation therewith, said substrate having a metal core and a ceramic coating;
   rectifying means secured to said substrate for rectifying the ac signal;
   ac conductor means having a first end connected to the windings and a second end for supplying the ac signal to the rectifying means; and
   conductor means secured to said substrate on which a DC signal is provided upon rotation of the shaft and the rotating rectifier assembly.

2. The rotating rectifier assembly as claimed in claim 1, further comprising:
   a conductive bus bar secured to said second end of said ac conductor means and to said rectifying means: and
   a ring disposed about the shaft and secured to said substrate such that said bus bar curls around said ring, whereby said ring opposes centrifugal forces exerted on said bus bar during rotation of the shaft.

3. The rotating rectifier assembly as claimed in claim 1, wherein said ceramic coating covers a top surface and a bottom surface of said metal core.

4. The rotating rectifier assembly as claimed in claim 1, wherein said rectifier means are secured to said substrate on a conductive layer.

5. The rotating rectifier assembly as claimed in claim 4, wherein said conductive layer comprises silver.

6. The rotating rectifier assembly as claimed in claim 1, wherein said substrate electrically insulates said rectifying means from the shaft.

7. The rotating rectifier assembly as claimed in claim 6, wherein said substrate provides a heat conduction path from said rectifying means to the shaft.

8. The rotating rectifier assembly as claimed in claim 1, wherein said substrate further comprises a layer of conductive material on a portion of a surface of said substrate in a predetermined pattern.

9. The rotating rectifier assembly as claimed in claim 8, wherein each of said layers of conductive material is heat bonded and sintered to said surface of said substrate in said predetermined pattern.

10. The rotating rectifier assembly as claimed in claim 8, wherein said conductive material is a metal.

11. The rotating rectifier assembly as claimed in claim 10, wherein said metal is an alloy of nickel or iron.

12. The rotating rectifier assembly as claimed in claim 3, wherein said metal core is a composite structure comprising a nickel base and a coating of Alloy 214 on each side of said nickel base.

13. The rotating rectifier assembly as claimed in claim 12, wherein said nickel base is approximately 4.763 mm. thick, said coatings of Alloy 214 are approximately 0.229 mm. thick and said ceramic coating is approximately 0.076 mm. thick.

14. The rotating rectifier assembly as claimed in claim 1, wherein said coating is a non-conductive layer comprising (on an oxide basis):
(a) from about 8 to about 26% by weight of magnesium oxide (MgO) based on the total weight of the coating;
(b) from about 10 to about 49% by weight of aluminum oxide ($Al_2O_3$) based on the total weight of the coating;
(c) from about 42 to about 68% by weight oxide ($SiO_2$) based on the total weight of the coating; and
(d) from about 1 to about 15% by weight, based on the total weight of MgO, $Al_2O_3$ and $SiO_2$ in the coating of one or more alkali metal or alkaline earth metal oxides, boron oxide and ZnO.

15. The rotating rectifier assembly as claimed in claim 14, wherein said coating comprises cordierite (2MgO-2$Al_2O_3$-5$SiO_2$).

16. The rotating rectifier assembly as claimed in claim 14, wherein said coating comprises cordierite (2MgO-2$Al_2O_3$-5$SiO_2$) and sapphirine (4MgO-5$Al_2O_3$-2$SiO_2$).

17. The rotating rectifier assembly as claimed in claim 14, wherein said coating further comprises (on an oxide basis):
(d) from about 5 to about 12% by weight based on the total weight of $Al_2O_3$, MgO and $SiO_2$ in the coating, of one or more alkali metal, alkaline earth metal, and zinc oxides and boron oxide.

18. The rotating rectifier assembly as claimed in claim 15, wherein said coating further comprises (on an oxide basis):
(d) from about 7 to about 9% by weight of one or more alkali metal and/or alkaline earth metal oxides, zinc oxide and boron oxides.

19. The rotating rectifier assembly as claimed in claim 14, wherein said coating further comprises (on an oxide basis):
(e) up to about 11% by weight based on the total weight of $Al_2O_3$, $SiO_2$ and MgO of a transition or transition earth metal oxide which functions as a nucleating agent and/or a flux.

20. The rotating rectifier assembly as claimed in claim 14, wherein said ceramic coating has a thermal coefficient of expansion of from about 50° to about 250° C. less than about 4 ppm/° C. and said metal core has a thermal coefficient of expansion from about 50° to about 250° C. greater than about 12 ppm/° C.

21. The rotating rectifier assembly as claimed in claim 20, wherein said ceramic coating has a dielectric constant of less than about 8.

22. The rotating rectifier assembly as claimed in claim 1, wherein said metal core is a composite structure.

23. The rotating rectifier assembly as claimed in claim 22, wherein said metal core has outer layers composed of an alloy of nickel or iron and an inner layer composed of a metal having thermal conductivity greater than that of said outer layers.

24. The rotating rectifier assembly as claimed in claim 23, wherein said outer layers are composed of a nickel based alloy containing chromium, aluminum, iron, and yttrium.

25. The rotating rectifier assembly as claimed in claim 24, wherein said outer layers are composed of Haynes Alloy number 214 of nominal composition 77 weight percent nickel, 16 weight chromium, 4.5 weight percent aluminum, 2.5 weight percent iron and a trace of yttrium.

* * * * *